United States Patent
Gunawan et al.

(10) Patent No.: US 11,735,343 B2
(45) Date of Patent: Aug. 22, 2023

(54) CONTROL ELECTRONICS FOR A PARALLEL DIPOLE LINE TRAP

(71) Applicant: International Business Machines Corporation, Armonk, NY (US)

(72) Inventors: Oki Gunawan, Westwood, NJ (US); Wang Zhou, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 964 days.

(21) Appl. No.: 16/293,212

(22) Filed: Mar. 5, 2019

(65) Prior Publication Data
US 2020/0286655 A1 Sep. 10, 2020

(51) Int. Cl.
*H01F 7/02* (2006.01)
*H01L 31/02* (2006.01)
*G01N 27/72* (2006.01)
*H10K 39/30* (2023.01)

(52) U.S. Cl.
CPC ........... *H01F 7/0273* (2013.01); *G01N 27/72* (2013.01); *H01L 31/02024* (2013.01); *H10K 39/30* (2023.02)

(58) Field of Classification Search
CPC ..... H01F 7/0273; H01F 7/0236; G01N 27/72; H01L 27/305; H01L 31/02024
See application file for complete search history.

(56) References Cited

U.S. PATENT DOCUMENTS

| | | |
|---|---|---|
| 8,895,355 B2 | 11/2014 | Cao et al. |
| 9,041,389 B2 | 5/2015 | Gokmen et al. |
| 9,093,377 B2 | 7/2015 | Cao et al. |
| 9,236,293 B2 | 1/2016 | Cao et al. |
| 9,263,669 B2 | 2/2016 | Cao et al. |
| 9,424,971 B2 | 8/2016 | Cao et al. |
| 9,678,040 B2 | 6/2017 | Gunawan et al. |
| 10,031,058 B2 | 7/2018 | Gunawan et al. |
| 10,082,408 B2 | 9/2018 | Gunawan |
| 10,128,013 B1 | 11/2018 | Gunawan et al. |
| 2017/0045433 A1 | 2/2017 | Gunawan et al. |
| 2017/0299410 A1 | 10/2017 | Gunawan |
| 2017/0301445 A1* | 10/2017 | Gunawan .............. H01F 7/0236 |
| 2018/0003495 A1 | 1/2018 | Gunawan |
| 2018/0031716 A1 | 2/2018 | Gunawan et al. |
| 2018/0247748 A1 | 8/2018 | Gunawan |

OTHER PUBLICATIONS

McDonald, Rotational Stability of a Diamagnetic Rod, Laboratories, Princeton University, 2017 (Year: 2017).*

(Continued)

*Primary Examiner* — Daniel R Miller
(74) *Attorney, Agent, or Firm* — Amin, Turocy & Watson, LLP

(57) ABSTRACT

Techniques regarding operating one or more parallel dipole line traps are provided. For example, one or more embodiments described herein can comprise a system, which can comprise a parallel dipole line trap comprising a diamagnetic object positioned between a plurality of dipole line magnets. The system can also comprise a split photodetector sensor positioned adjacent to the parallel dipole line trap. The split photodetector sensor can detect a displacement of the diamagnetic object.

20 Claims, 12 Drawing Sheets

(56) References Cited

OTHER PUBLICATIONS

B. Ando, S. Baglio, V. Marietta and A. Valastro, "A Short-Range Inertial Sensor Exploiting Magnetic Levitation and an Inductive Readout Strategy," in IEEE Transactions on Instrumentation and Measurement, vol. 67, No. 5, pp. 1238-1245, May 2018 (Year: 2018).*

Gunawan, Oki, et al. "A parallel dipole line system." Applied Physics Letters 106, 062407 (2015). 23 pages.

Gunawan, Oki, et al. "The one-dimensional camelback potential in the parallel dipole line trap: Stability conditions and finite size effect." Journal of Applied Physics 121, 133902 (2017). 10 pages.

"What is the Internet of Things?" NCTA the Internet and Television Asssocation, https://www.ncta.com/positions/internet-of-things. Last Accessed Feb. 5, 2019. 8 pages.

* cited by examiner

- 1102: PROJECTING LIGHT TOWARDS A FIRST SIDE OF A PARALLEL DIPOLE LINE TRAP, WHEREIN THE PARALLEL DIPOLE LINE TRAP COMPRISES A DIAMAGNETIC OBJECT LEVITATING BETWEEN A PLURALITY OF DIPOLE LINE MAGNETS

- 1104: APPLYING A BIAS VOLTAGE TO AN ELECTRODE THAT AT LEAST PARTIALLY SURROUNDS THE DIAMAGNETIC OBJECT TO CHANGE AN ELECTRIC POTENTIAL OF THE PARALLEL DIPOLE LINE TRAP AND CONTROL A DISPLACEMENT OF THE DIAMAGNETIC OBJECT

- 1106: DETERMINING THE DISPLACEMENT OF THE DIAMAGNETIC OBJECT BASED ON A PRESENCE OF THE LIGHT AT A SECOND SIDE OF THE PARALLEL DIPOLE LINE TRAP

- 1108: MEASURING A CAPACITANCE OF THE PARALLEL DIPOLE LINE TRAP, WHEREIN THE DETERMINING THE DISPLACEMENT OF THE DIAMAGNETIC OBJECT IS FURTHER BASED ON THE CAPACITANCE

CONTROL ELECTRONICS FOR A PARALLEL DIPOLE LINE TRAP

BACKGROUND

The subject disclosure relates to a parallel dipole line trap system, and more specifically, to one or more devices for controlling and/or operating a parallel dipole line trap.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, and/or apparatuses controlling and/or sensing operations for one or more parallel dipole line traps are described.

According to an embodiment, a system is provided. The system can comprise a parallel dipole line trap comprising a diamagnetic object positioned between a plurality of dipole line magnets. The system can also comprise a split photodetector sensor positioned adjacent to the parallel dipole line trap. The split photodetector sensor can detect a displacement of the diamagnetic object.

According to another embodiment, a method is provided. The method can comprise projecting light towards a first side of a parallel dipole line trap. The parallel dipole line trap can comprise a diamagnetic object levitating between a plurality of dipole line magnet. The method can also comprise determining a displacement of the diamagnetic object based on a presence of the light at a second side of the parallel dipole line trap.

According to another embodiment, an apparatus is provided. The apparatus can comprise a parallel dipole line trap comprising a diamagnetic object positioned between a plurality of dipole line magnets. The apparatus can also comprise sensory circuitry, positioned adjacent to the parallel dipole line trap, and comprising a photodetector to detect a displacement of the diamagnetic object.

BRIEF DESCRIPTION OF THE DRAWINGS

FIG. 11 illustrates a flow diagram of an example, non-limiting method that can facilitate controlling capacitance sensing and/or optical sensing functionality of one or more parallel dipole line trap systems in accordance with one or more embodiments described herein.

DETAILED DESCRIPTION

Figure 1:
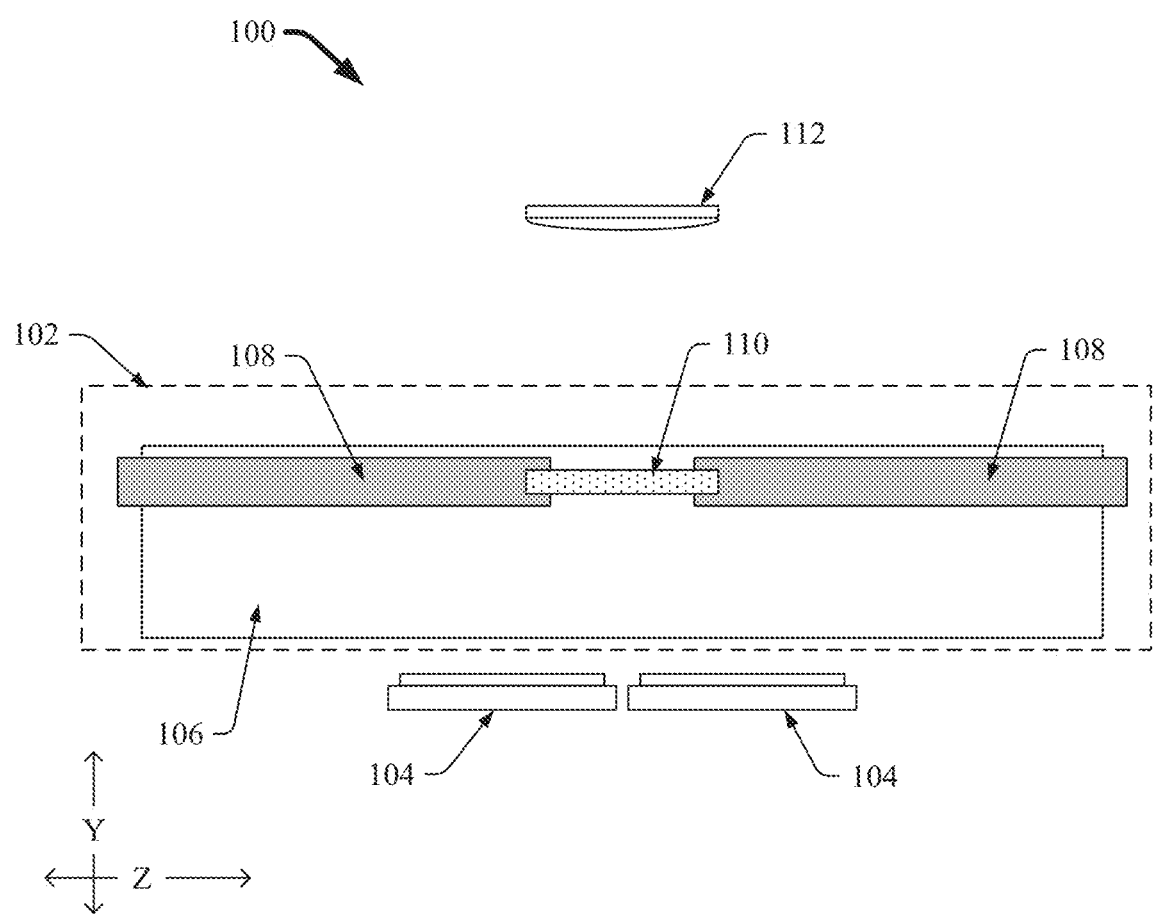
FIG. 1 illustrates a block diagram of an example, non-limiting system that can comprise one or more parallel dipole line traps, which can include one or more split photodetectors in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. Additionally, features depicted in the drawings with like shading and/or coloring can comprise shared compositions and/or materials.

Parallel dipole line ("PDL") traps enable the trapping of one or more diamagnetic objects using dipole line and/or transversely magnetized magnets due to the existence of a camelback magnetic potential occurring along the longitudinal axis of the PDL trap. Once the one or more diamagnetic objects are contained in the PDL trap, one or more detection techniques are required to manipulate and/or detect the position of the one or more diamagnetic objects for various functions and/or sensing applications. The position can be detected by optical or capacitive technology. However, conventional capacitance-based detection techniques prohibit the simultaneous manipulation and detection of the one or more diamagnetic objects.

Various embodiments described herein can comprise one or more systems, methods, and/or apparatuses regarding the operation of one or more PDL traps using optical detection technologies in addition to, or alternatively to, one or more capacitance detection technologies. For example, one or more embodiments can comprise one or more split photodetectors that can optically detect the position of one or more diamagnetic objects trapped within the subject PDL trap. Advantageously, the use of optical detection methods can enable various embodiments of the PDL trap to manipulate the position of the one or more diamagnetic objects while simultaneously detecting the position of the one or more diamagnetic objects.

FIG. 1 illustrates a diagram of an example, non-limiting cross-sectional view of a system 100 that can comprise one or more PDL traps 102 that can include one or more split photodetectors 104 in accordance with one or more embodiments described herein. Repetitive description of like elements employed in other embodiments described herein is omitted for sake of brevity.

The one or more PDL traps 102 can comprise: one or more magnets 106, one or more electrodes 108, and/or one or more diamagnetic objects 110. In one or more embodiments, the one or more PDL traps 102 can use voltage biased electrodes 108 to facilitate voltage-tunable one-dimensional potential for manipulating (e.g., moving) one or more diamagnetic objects 110. The one or more PDL traps 102 can be utilized in various applications, including, but not limited to: Hall measurement systems, viscometers, pressure gauges, seismometer, inclinometers, gravimeters, magnetic susceptometers, shock sensors, bio sensors, a combination thereof, and/or the like.

In various embodiments, the one or more PDL traps 102 can comprise two magnets 106 positioned adjacent to each other. The magnets 106 can be transversely magnetized (e.g., diametric) magnets that can naturally join together due to magnetic attraction, and/or can be separated by a gap. For example, the magnets 106 can be characterized by an elongated shape, including, but not limited to: a cylinder shape, a bar shape, a stripe, a combination thereof, and/or the like. Further the magnetization of the magnets 106 can be directed in the transverse direction. One of ordinary skill in the art will recognize that the adjacent magnets 106 can create a symmetric "camelback" magnetic field potential (e.g., along the longitudinal "Z" axis), which can trap the one or more diamagnetic objects 110 (e.g., as shown in FIG. 1).

The one or more electrodes 108 can be electrically conductive and/or comprise a non-magnetic metal. Example materials that can comprise the one or more electrodes 108 can include, but are not limited to: copper, aluminum, brass, metal films deposited around a glass tube, a combination thereof, and/or the like. The one or more electrodes 108 can be mounted to one or more fixtures (not shown for ease and/or clarity of depiction) positioned at one or more sides of the PDL trap 102. In various embodiments, the one or more electrodes 108 can at least partially surround the one or more diamagnetic objects 110. For example, the one or more electrodes 108 can be configured as shells that can at least partially wrap around the one or more diamagnetic objects 110. Further, the electrodes 108 can be positioned such that a gap is formed between adjacent electrodes 108 (e.g., as shown in FIG. 1). Additionally, the gap between adjacent electrodes 108 can be smaller than the length of the one or more diamagnetic objects 110.

The one or more diamagnetic objects 110 can levitate above the one or more magnets 106 (e.g., due to at least the magnetic potential of the magnets 106). Example diamagnetic materials that can comprise the one or more diamagnetic objects 110 (e.g., materials having a negative magnetic susceptibility) can include, but are not limited to: graphite, diamond, bismuth, superconductor materials, a combination thereof, and/or the like. Wherein the one or more electrodes 108 are configured as shells at least partially surrounding the one or more diamagnetic objects 110, the one or more diamagnetic objects 110 can travel along the "Z" axis within the one or more electrodes 108 without contacting the one or more electrodes 108. Additionally, the one or more diamagnetic objects 110 can travel along the "Z" axis between the electrodes 108 without contacting the one or more electrodes 108. For instance, the one or more diamagnetic objects 110 can oscillate along the "Z" axis shown in FIG. 1 between a pair of magnets 106. Example shapes that can characterize the one or more diamagnetic objects 110 can include, but are not limited to: a rod shape (e.g., a cylindrical shape), a rectangular bar, any elongated shape, a combination thereof, and/or the like.

In various embodiments, the system 100 can further comprise one or more light sources 112 and/or one or more split photodetectors 104 positioned at opposite sides of the one or more PDL traps 102. Example light sources 112 can include, but are not limited to: incandescent light sources, luminescent light sources (e.g., light emitting diodes), combustion light sources (e.g., candles), electric arc light sources, gas discharge light sources, high-intensity discharge light sources, lasers, a combination thereof, and/or the like. As shown in FIG. 1, the one or more light sources 112 can be positioned over the one or more PDL traps 102. Further, the one or more light sources 112 can be positioned over gaps between adjacent electrodes 108. In addition, one or more split photodetectors 104 can be positioned opposite the one or more light sources 112 such that the one or more PDL traps 102 are located between the one or more light sources 112 and/or the one or more split photodetectors 104. For instance, the one or more split photodetectors 104 can be positioned beneath the one or more PDL traps 102 (e.g., as shown in FIG. 1).

Example types of split photodetectors 104 can include, but are not limited to: photoelectric effect photodetectors, thermal photodetectors, polarization photodetectors, photochemical photodetectors, photodetectors that utilize weak interaction effects, a combination thereof, and/or the like. In one or more embodiments, the one or more light sources 112 can generate and/or project light having a wavelength of greater than or equal to 200 nanometers (nm) and less than or equal to 2,000 nm.

As the one or more diamagnetic objects 110 move along the "Z" axis, the position of the one or more diamagnetic objects 110 can be determined based on a differential signal of the amount of light detected by the one or more split photodetectors 104. For example, if an amount of light detected by the one or more split photodetectors 104 is less than a defined threshold (e.g., close to zero), the system 100 can determine that the one or more diamagnetic objects 110 are positioned within the middle of the one or more gaps between electrodes 108 (e.g., as depicted in FIG. 1). As the one or more diamagnetic objects 110 move along the "Z" axis to positions right of, or left of, the middle of the gap, light generated by the one or more light sources can travel through the PDL trap 102 (e.g., at least partially unblocked by the one or more diamagnetic objects 110) and be detected by one or more of the split photodetectors 104. Thus, the system 100 can determine which direction the one or more diamagnetic objects 110 is traveling based upon the polarity of the differential signal from which the split photodetectors 104 detect amounts of light. Further, the system 100 can determine how far the one or more diamagnetic objects 110 have traveled based upon the amount of light detected by the one or more split photodetectors 104. For example, the further the one or more diamagnetic objects 110 travel from the middle of a gap between electrodes 108, the more light generated by the one or more light sources 112 can reach the one or more split photodetectors 104.

Figure 2:
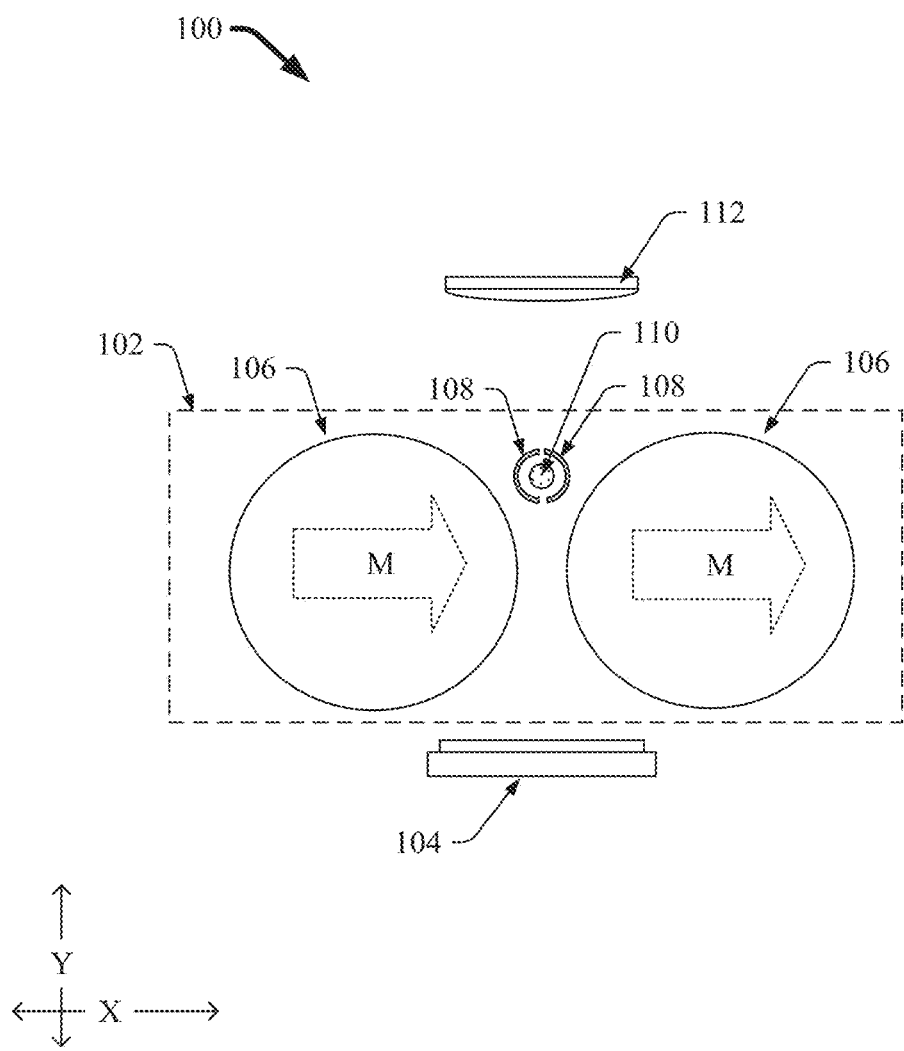
FIG. 2 illustrates a block diagram of an example, non-limiting system that can comprise one or more parallel dipole line traps, which can include one or more split photodetectors in accordance with one or more embodiments described herein.

FIG. 2 illustrates an example, non-limiting side view of the system 100 in accordance with one or more embodiments described herein. Repetitive description of like elements employed in other embodiments described herein is omitted for sake of brevity. As shown in FIG. 2, the "M" arrows can represent the magnetizations of the magnets 106, wherein the arrow tips can represent the north pole.

In one or more embodiments, the one or more diamagnetic objects 110 can levitate between the pair of magnets 106. Further, the one or more light sources 112 and/or the one or more split photodetectors 104 can be located adjacent to the PDL trap 102 and aligned with the gap between the magnets 106 along the "X" axis (e.g., as shown in FIG. 2). Thus, light generated by the one or more light sources 112 can be projected (e.g., by the one or more light sources 112) through the PDL trap 102 (e.g., between the magnets 106) to the one or more split photodetectors 104 (e.g., depending on the position of the one or more diamagnetic objects 110. Additionally, FIG. 2 depicts the one or more electrodes 108 arranged in a shell configuration at least partially surrounding the one or more diamagnetic objects 110.

Figure 3:
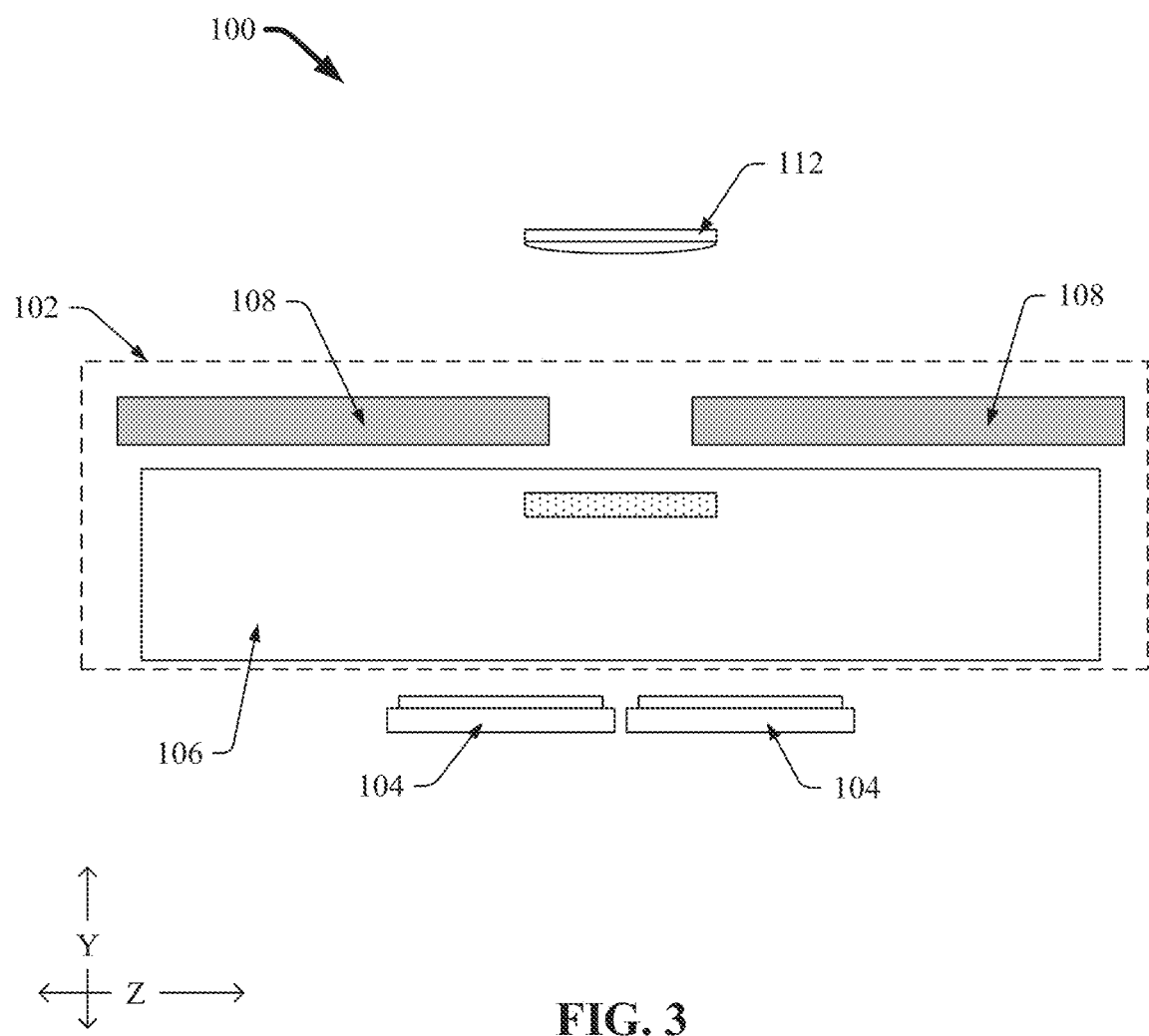
FIG. 3 illustrates a block diagram of an example, non-limiting system that can comprise one or more parallel dipole line traps with a variant electrode configuration, and can include one or more split photodetectors in accordance with one or more embodiments described herein.

FIG. 3 illustrates a diagram of an example, non-limiting cross-sectional view of the system 100 comprising an alternate electrode 108 configuration in accordance with one or more embodiments described herein. Repetitive description of like elements employed in other embodiments described herein is omitted for sake of brevity. As shown in FIG. 3, the one or more electrodes 108 can be positioned above the magnets 106 and/or the one or more diamagnetic objects 110 (e.g., rather than at least partially surrounding the one or more diamagnetic objects 110, as shown in FIGS. 1 and 2). In various embodiments, the one or more electrodes 108 can be, for example, a cylindrical rod and/or metal plate.

In the electrode 108 configuration depicted in FIG. 3, the position of one or more electrodes 108 can overlap the position of the one or more diamagnetic objects 110 along the "Z" axis. As the one or more diamagnetic objects 110 oscillate along the "Z" axis, the one or more diamagnetic objects 110 can travel adjacent to (e.g., directly beneath) the one or more electrodes 108.

Figure 4:
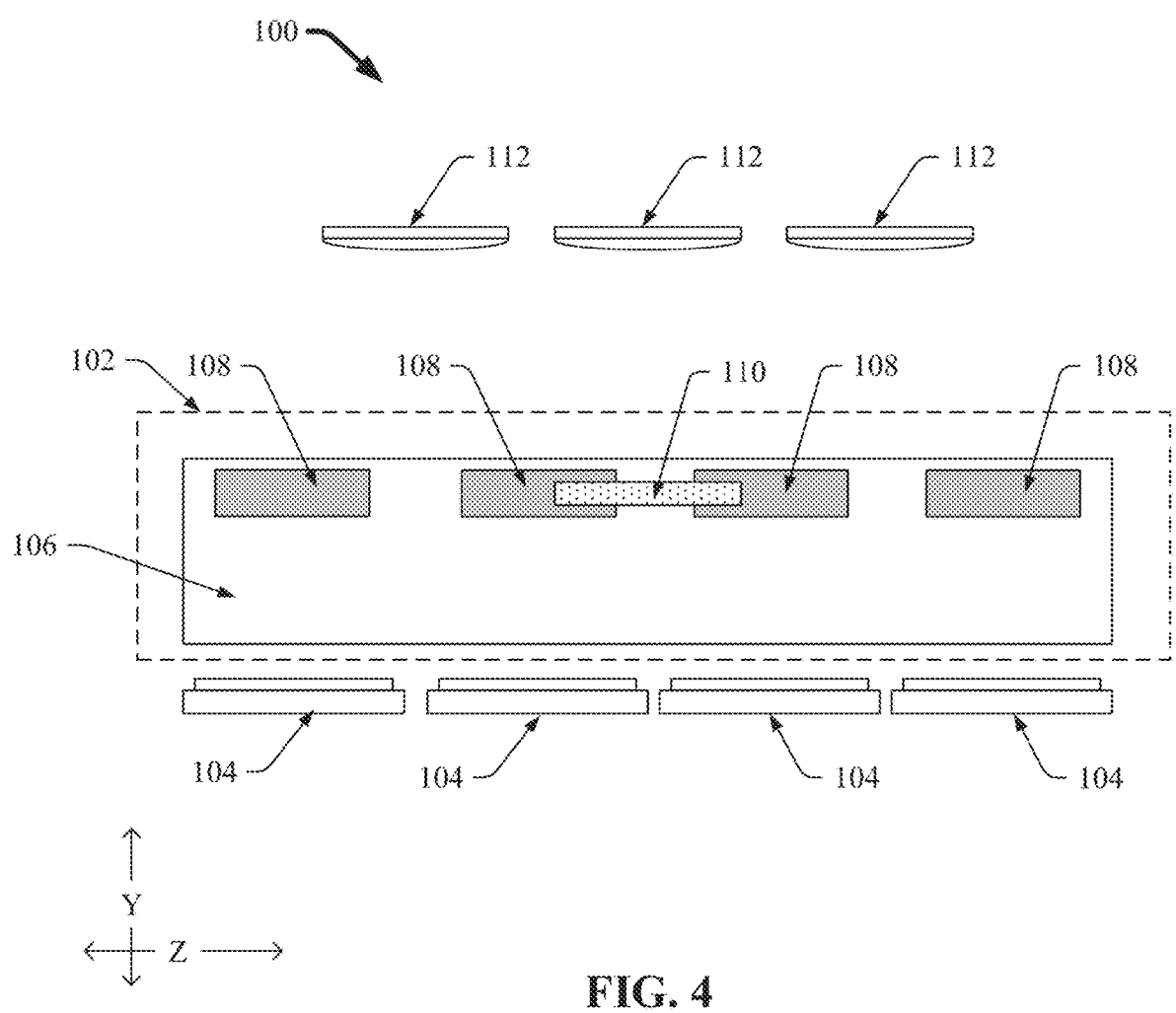
FIG. 4 illustrates a block diagram of an example, non-limiting system that can comprise one or more parallel dipole line traps, which can include multiple split photodetectors in accordance with one or more embodiments described herein.

FIG. 4 illustrates a diagram of an example, non-limiting cross-sectional view of the system 100 comprising multiple light sources 112 and/or split photodetectors 104 in accordance with one or more embodiments described herein. Repetitive description of like elements employed in other embodiments described herein is omitted for sake of brevity. As shown in FIG. 4, the system 100 can comprise a plurality of light sources 112, electrodes 108, and/or split photodetectors 104.

A multitude of electrodes 108 can define a plurality of gaps (e.g., between adjacent electrodes 108), wherein a plurality of light sources 112 and/or split photodetectors 104 can be aligned with the plurality of gaps. By incorporating multiple gaps between adjacent electrodes 108 and corresponding light sources 112 and/or split photodetectors 104, the system 100 can determine the position of the one or more diamagnetic objects 110 with increased accuracy (e.g., as compared to embodiments with fewer gaps between electrodes 108). For example, as the one or more diamagnetic objects 110 travel along the "Z" axis, the one or more diamagnetic objects 110 can influence (e.g., inhibit) light passing through respective gaps; thereby, split photodetectors 104 associated with the respective gaps can detect the position of the one or more diamagnetic objects 110.

Figure 5:
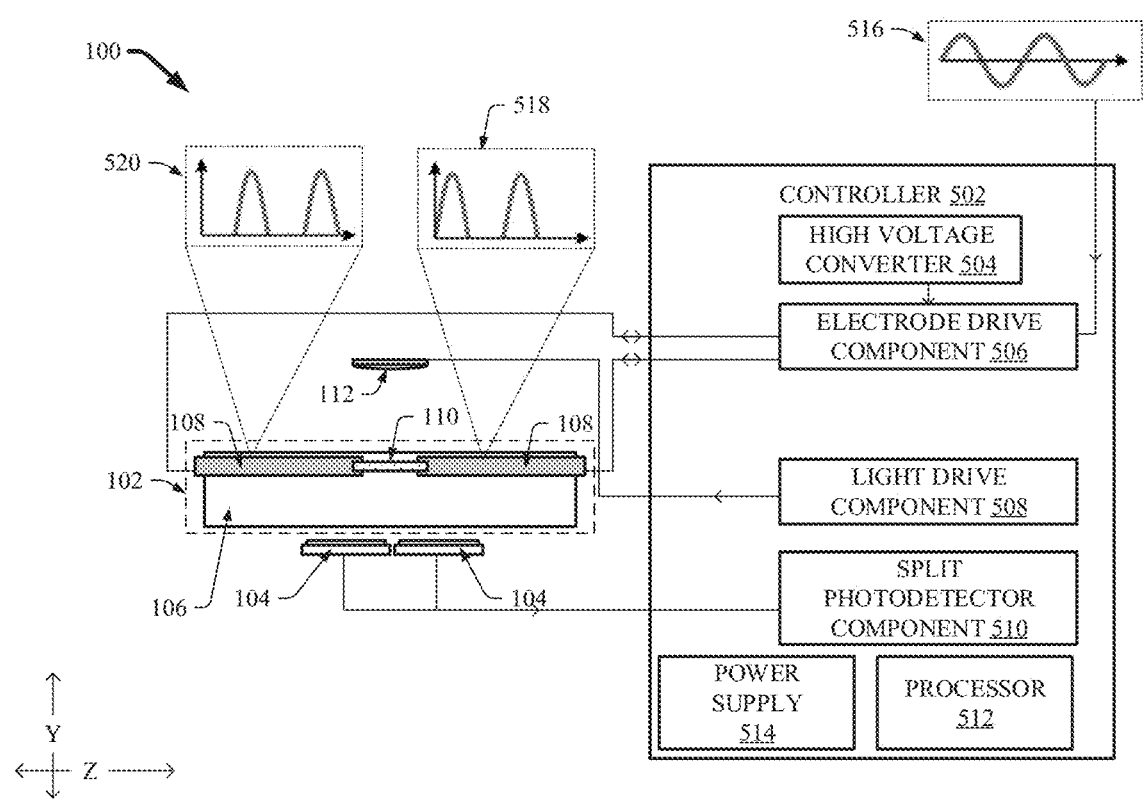
FIG. 5 illustrates a block diagram of an example, non-limiting system that can comprise one or more parallel dipole line traps operatively coupled to one or more controllers in accordance with one or more embodiments described herein.

FIG. 5 illustrates a diagram of the example, non-limiting system 100 further comprising one or more controllers 502 that can facilitate operation of the one or more PDL traps 102 in accordance with one or more embodiments described herein. Repetitive description of like elements employed in other embodiments described herein is omitted for sake of brevity. In one or more embodiments, the one or more controllers 502 can comprise, for example: one or more high voltage converters 504, one or more electrode drive components 506, one or more light drive components 508, one or more split photodetector components 510, one or more processors 512, and/or one or more power supplies 514. In various embodiments, the features of the one or more controllers 502 (e.g., one or more high voltage converters 504, one or more electrode drive components 506, one or more light drive components 508, one or more split photodetector components 510, one or more processors 512, and/or one or more power supplies 514) can be operatively coupled to each other (e.g., via a wireless network and/or a direct electrical connection).

The one or more controllers 502 can control one or more operations of the one or more PDL traps 102, such as manipulating the position of the one or more diamagnetic objects 110 and/or monitoring the position of the one or more diamagnetic objects 110. The one or more electrode drive components 506 can receive an input signal 516 and/or split the input signal 516 to electrically bias one or more of the electrodes 108. For example, the electrode drive component 506 can be operatively coupled (e.g., via a direct electrical connection) to the one or more electrodes 108 (e.g., as shown in FIG. 5). The electrode drive component 506 can split the input signal 516 into a first drive signal 518 and/or a second drive signal 520. For example, the input signal 516 can be characterized as a cosine function (e.g., as depicted in FIG. 5), wherein the electrode drive component 506 can split a positive portion of the input signal 516 to form the first drive signal 518, which can drive one or more electrodes 108 (e.g., as shown in FIG. 5). Additionally, the electrode drive component 506 can split a negative portion of the input signal 516 to form the second drive signal 520, which can drive one or more other electrodes 108 (e.g., as shown in FIG. 5).

In one or more embodiments, the one or more controllers 502 can further comprise one or more high voltage converters 504 operatively coupled to the one or more electrode drive components 506. The one or more high voltage converters 504 can convert typically low voltage direct current ("DC") power supplies to high voltage power supplies (e.g., ranging between 20 to 1,000 volts (V) that can provide the voltage needed for high voltage amplification performed by the one or more electrode drive components 506.

The one or more light drive components 508 can be operatively coupled to the one or more light sources 112 (e.g., via a direct electrical connection). Further, the one or more light drive components 508 can control the one or more light sources 112. The one or more light drive components 508 can tune the one or more light sources 112 in accordance with one or more preferences of a user of the system 100 and/or the one or more split photodetectors 104. For example, the one or more light sources 112 can modulate: the wavelength of light projected by the one or more light sources 112, the intensity of light projected by the one or more light sources 112, the duty cycle (e.g., how often) that light is projected from the one or more light sources 112, how long light is projected from the one or more light sources 112, which of the light sources 112 are active, a combination thereof, and/or the like.

Furthermore, the one or more split photodetector components 510 can be operatively coupled to the one or more split photodetectors 104 (e.g., via a direct electrical connection). The one or more split photodetector components 510 can process a signal from the one or more split photodetectors 104. For example, the one or more split photodetector components 510 can read the light intensity from each half of the one or more split photodetectors 104, subtract both signals, and/or amplify it to yield a position signal of the one or more trapped diamagnetic objects 110. In other words, the one or more split photodetector components 510 can generate a position signal that characterizes a differential between the amount of light detected amongst the split photodetectors 104.

In various embodiments, one or more processors 512 can be operatively coupled (e.g., via a direct electrical connection) to one or more other features comprised within the one or more controllers 502 (e.g., the one or more electrode drive components 506, the one or more light drive components 508, and/or the one or more split photodetector components 510). In one or more embodiments, the one or more processors 512 can be comprised within one or more computing devices, such as a microprocessor. In various embodiments, the one or more processors 512 can receive the positional signal and determine one or more parameters regarding the one or more diamagnetic objects 110. For example, the one or more processors 512 can determine a position of the one or more diamagnetic objects 110 (e.g., in relation to the PDL trap 102), a velocity and/or acceleration of the one or more diamagnetic objects 110, a combination thereof, and/or the like. In addition, the one or more processors 512 can generate one or more command signals to control operation of one or more other features of the controller 502. For example, the one or more processors 512 can control operation of the one or more electrode drive components 506, high voltage converters 504, light drive components 508, split photodetector components 510, and/or power supplies 514. Moreover, the one or more processors 512 can serve as interface with one or more external devices to facilitate execution of one or more experiment and/or monitoring tasks and/or to send out reading signals (e.g., the position of the one or more diamagnetic objects 110. The one or more processors 512 can also monitor environmental parameters such as time, temperature and humidity of the system 100.

Furthermore, one or more power supplies 514 can be operatively coupled (e.g., via a direct electrical connection) to one or more other features comprised within the one or more controllers 502 (e.g., the one or more high voltage converters 504, electrode drive components 506, the one or more light drive components 508, and/or the one or more split photodetector components 510). The one or more power supplies 514 can provide electrical power to the various features of the one or more controllers 502, thereby enabling operation of the one or more controllers 502.

Figure 6A:
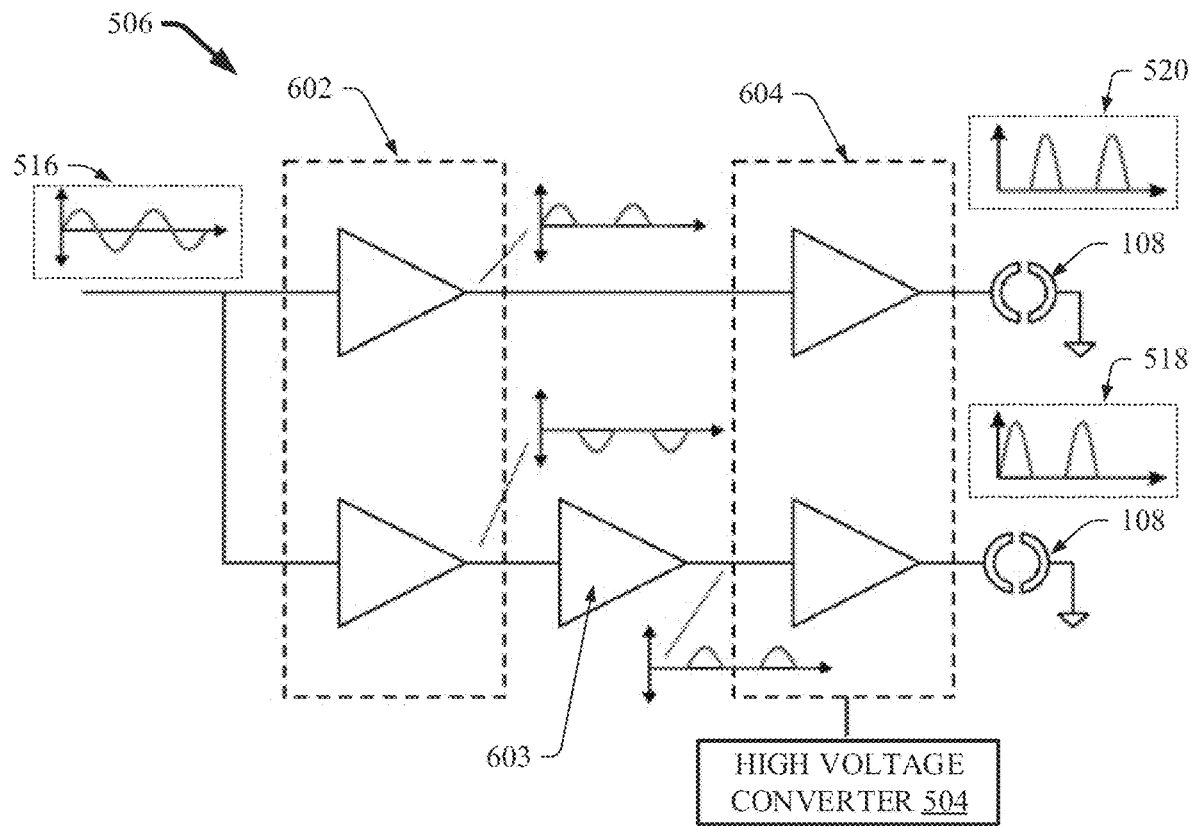
FIG. 6A illustrates a block diagram of an example, non-limiting electrode drive component that can be comprised within one or more controllers for operating and/or monitoring one or more parallel dipole line traps in accordance with one or more embodiments described herein.

FIG. 6A illustrates a diagram of an example, non-limiting circuitry layout for the one or more electrode drive components 506. Repetitive description of like elements employed in other embodiments described herein is omitted for sake of brevity. As shown in FIG. 6A, the one or more electrode drive components 506 can comprise one or more half wave splitters 602, inverters 603, and/or high voltage amplifiers 604.

In various embodiments, the one or more electrode drive components 506 can manipulate the position of the one or more diamagnetic objects 110 by applying high voltages to the one or more electrodes 108. When the input signal 516 is positive, for example, a first electrode 108 (e.g., positioned at a right side of the PDL trap 102) can pull the one or more diamagnetic objects 110 in a first direction (e.g., towards the right of the PDL trap 102). In contrast, when the input signal 516 is negative, a second electrode 108 (e.g., positioned at a left side of the PDL trap 102) can pull the one or more diamagnetic objects 110 in a second direction (e.g., towards the left of the PDL trap 102). The one or more electrode drive components 506 can be driven by a bipolar input signal 516, wherein the one or more electrode drive components 506 can splits the input signal 516 to positive and negative counterparts, rectify and amplify the counterparts, and feeds the counterparts (e.g., first drive signal 518 and/or second drive signal 520) to respective electrodes 108.

As shown in FIG. 6A, an exemplary circuitry layout of the one or more electrode drive components 506 can feed the input signal 516 to two half wave splitters 602. The half wave splitters 602 can rectify the positive and the negative part of the input signal 516 respectively. The negative part of the input signal 516 can then be fed to an inverter 603 to yield a positive voltage. Both parts of the input signal can then be amplified by one or more high voltage amplifiers 604 (e.g. to a range of 20 to 1,000 V) and fed to the one or more electrodes 108 (e.g., as shown in FIG. 6A). The high voltage can be necessary to provide sufficient drive to the one or more trapped diamagnetic objects 110. Further, the high voltage amplifiers 604 can be powered by a high voltage supply from the one or more high voltage converter component 504.

Figure 6B:
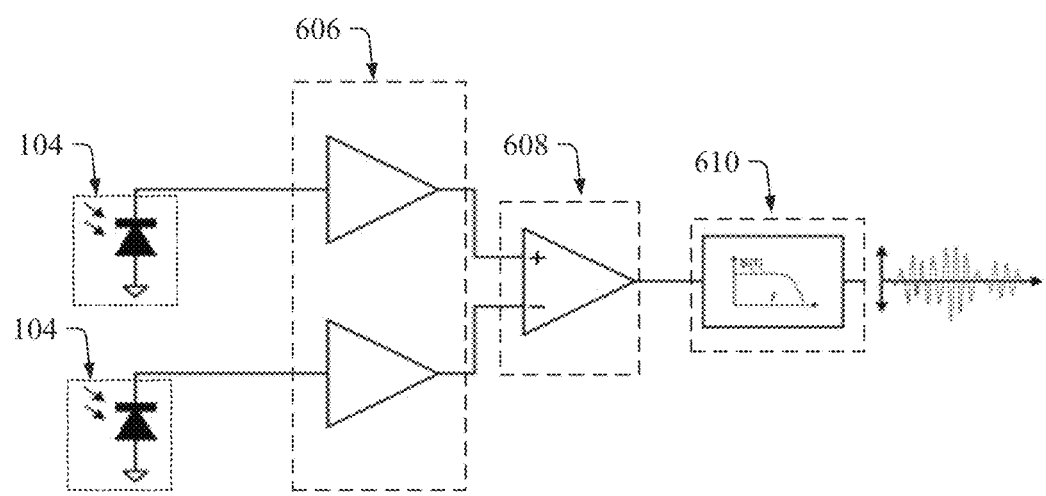
FIG. 6B illustrates a block diagram of an example, non-limiting split photodetector component that can be comprised within one or more controllers for operating and/or monitoring one or more parallel dipole line traps in accordance with one or more embodiments described herein.

FIG. 6B illustrates a diagram of an example, non-limiting circuitry layout for the one or more split photodetector components 510. Repetitive description of like elements employed in other embodiments described herein is omitted for sake of brevity. As shown in FIG. 6B, the one or more split photodetector components 510 can comprise one or more transimpedance amplifiers 606, instrumentation amplifiers 608, and/or low pass filters 610.

As shown in FIG. 6B, an exemplary circuitry layout of the one or more split photodetector components 510 can feed photocurrents generated by the split photodetectors 104 to one or more transimpedance amplifiers 606, which can convert the photocurrents to voltage. The output voltage of the one or more transimpedance amplifiers 606 can then proportional to the light intensity impinging on each split photodetector 104 (e.g., each module of the respective split photodetectors 104). The voltages can then be fed to an instrumentation amplifier 608 for differential amplification. For example, the instrumentation amplifier 608 can subtract both voltage signal outputted from the transimpedance amplifiers 606 and then amplify the output signal by a certain tunable gain factor. Additionally, the output signal can be fed to one or more low pass filters 610 with a cut-off frequency ("$f_C$") to limit the bandwidth. For example, the bandwidth could be limited from DC to 100 hertz (Hz), so the system 100 can be immune to high frequency noise above $f_C$. This differential photodetector scheme is also advantageously be immune to the common mode light noise due to light source 112 fluctuation or ambient lighting that can be impacting both the split photodetectors 104.

Figure 7:
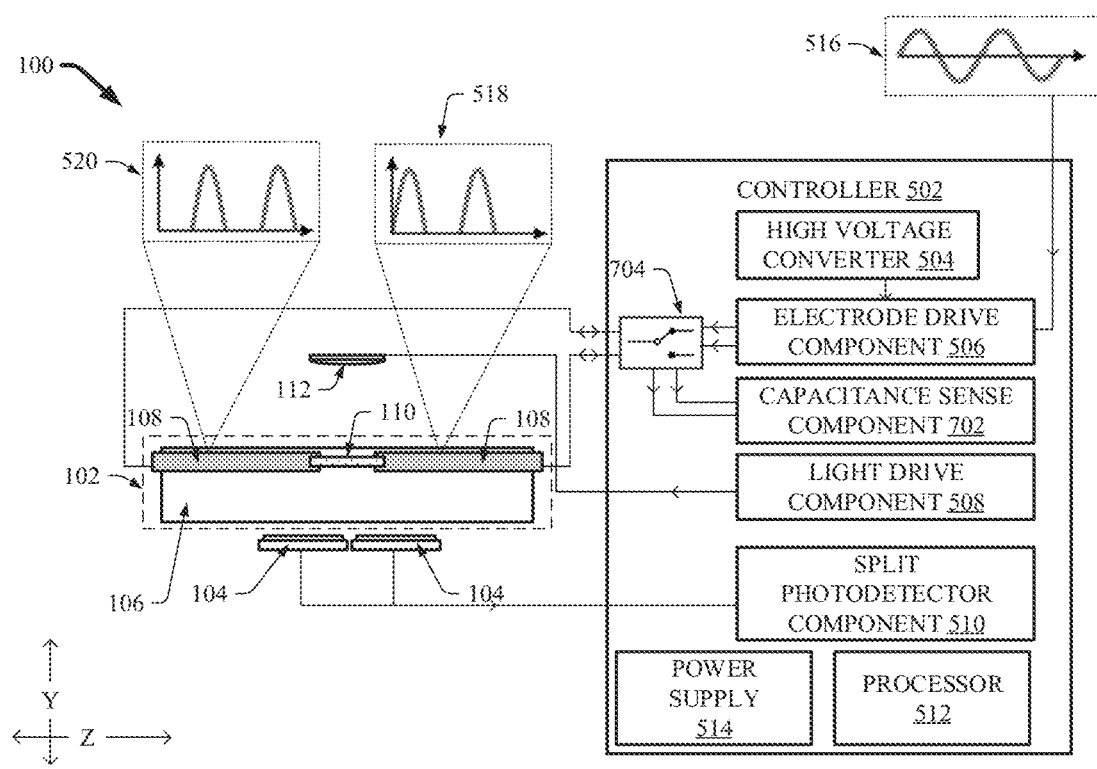
FIG. 7 illustrates a block diagram of an example, non-limiting system that can comprise one or more parallel dipole line traps operatively coupled to one or more controllers, which can enable capacitance sense and/or optical sense functionality in accordance with one or more embodiments described herein.

FIG. 7 illustrates a diagram of the example, non-limiting system 100 further comprising one or more capacitance sense components 702 and/or switches 704 in accordance with one or more embodiments described herein. Repetitive description of like elements employed in other embodiments described herein is omitted for sake of brevity. As shown in FIG. 7, the one or more capacitance sense components 702 and/or switches 704 can be comprised within the one or more controllers 502. In one or more embodiments, the one or more capacitance sense components 702 and/or switches 704 can be operatively coupled to one or more other features of the one or more controllers 502 (e.g., the one or more high voltage converters 504, electrode drive components 506, light drive components 508, split photodetector components 510, processors 512, and/or power supplies 514).

The one or more switches 704 (e.g., circuit switches and/or relays) can be located along an electrical connection between the one or more electrodes 108 of the PDL trap 102 and the electrode drive component 506 and capacitance sense component 702 of the one or more controllers 502 (e.g., as shown in FIG. 7). The one or more switches 704 can manage electrical coupling between the one or more electrodes 108 and the electrode drive component 506, and/or the one or more electrodes 108 and the capacitance sense component 702, such that the capacitance sense component 702 can be electrically decoupled from the one or more electrodes 108 during operation of the electrode drive component 506, and the electrode drive component 506 can be electrically decoupled from the one or more electrodes 108 during operation of the capacitance sense component 702. Thereby, operation of the one or more electrode drive components 506 can be performed uninterrupted by operation of the one or more capacitance sense components 702 and vise versa.

The one or more capacitance sense components 702 can detect displacement of the one or more diamagnetic objects 110 based on the capacitance of the one or more electrodes 108. For example, the capacitance of the one or more electrodes 108 can change based on the proximity of the one or more diamagnetic objects 110 to a subject electrode 108. For instance, the one or more diamagnetic objects 110 can screen out one or more electric fields, thereby altering the capacitance of adjacent electrodes 108 within the PDL trap 102. In one or more embodiments, the capacitance sense component 702 can comprise one or more capacitance sensors, which can perform differential capacitive sensing of the one or more electrodes 108. An example capacitance sensor can be the Analog Device AD7745/7746 capacitance sensor chip. When the one or more diamagnetic objects 110 near one of the electrodes 108 and leaving another electrode 108, the capacitance in the former can be larger than the other. Therefore, by performing differential capacitance measurement the one or more sense capacitance components 702 can detect the position of the one or more diamagnetic objects 110.

In one or more embodiments, a base capacitance measurement can be taken by the one or more capacitance sense components 702 prior to inclusion of the one or more diamagnetic objects 110 into the PDL trap 102. Thereby, capacitance measurements taken by the one or more capacitance sense components 702 after inclusion and displacement of the one or more diamagnetic objects 110 can be compared with the base capacitance measurement to determine a change in capacitance. Further, the one or more capacitance sense components 702 can generate one or more displacement signals delineating the diamagnetic object 110 displacement as a function of capacitance variance. The one or more displacement signals can characterize a differential between the capacitance of electrodes 108 and/or can indicate the one or more electrodes 108 associated with the differential. In various embodiments, the one or more processors 512 can receive the one or more displacement signals and/or use the one or more displacement signals to facilitate the determinations described herein.

In one or more embodiments, the system 100 comprises a plurality of techniques for detecting displacement and/or position of the one or more diamagnetic objects 110 within the one or more PDL traps 102. For example, the displacement and/or position of the one or more diamagnetic objects 110 can be detected via an optical-based techniques (e.g., via the one or more split photodetectors 104 and/or split photodetector component 510) and/or a capacitance-based techniques (e.g., via the one or more electrodes 108 and/or capacitance sense component 702). Each of the respective detection techniques can be characterized by advantages and disadvantages. For example, the capacitance-based techniques can provide a highly accurate and/or sensitive detection but during a separate time interval than during operation of the one or more electrode drive components 506. In another example, the optical-based techniques can be performed simultaneously with the operation of the electrode drive component 506 but provide a less sensitive detection than the capacitance-based techniques and can require more power. Advantageously, the various embodiments of the system 100 described herein can leverage the benefits of multiple detection techniques to overcome the shortcomings of any individual detection techniques.

Figure 8:
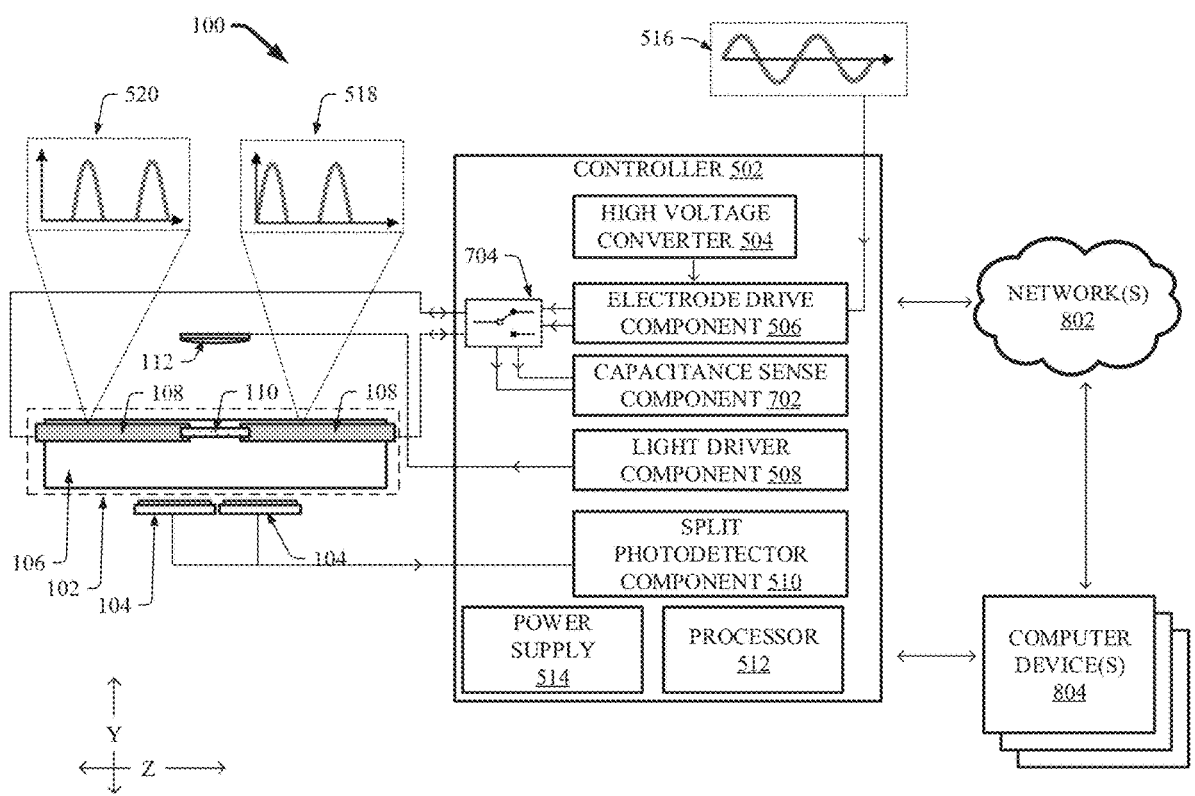
FIG. 8 illustrates a block diagram of an example, non-limiting system that can comprise one or more parallel dipole line traps operatively coupled to one or more controllers, which can communicate with one or more external networks and/or computer devices in accordance with one or more embodiments described herein.

FIG. 8 illustrates a diagram of the example, non-limiting system 100 further comprising one or more networks 802 and/or one or more computer devices 804 in accordance with one or more embodiments described herein. Repetitive description of like elements employed in other embodiments described herein is omitted for sake of brevity. As shown in FIG. 8, the one or more networks 802 and/or computer devices 804 can be operably coupled to the one or more controllers 502.

The one or more networks 802 can comprise wired and wireless networks, including, but not limited to, a cellular network, a wide area network ("WAN") (e.g., the Internet) or a local area network ("LAN"). For example, the one or more controllers 502 can communicate with the one or more computer devices 804 (and vice versa) using virtually any desired wired or wireless technology including for example, but not limited to: cellular, WAN, wireless fidelity ("Wi-Fi"), Wi-Max, WLAN, Bluetooth technology, a combination thereof, and/or the like. Additionally, the one or more networks 802 can facilitate communication between multiple controllers 502 (not shown).

The one or more computer devices 804 can comprise one or more computerized devices, which can include, but are not limited to: personal computers, desktop computers, laptop computers, cellular telephones (e.g., smartphones), computerized tablets (e.g., comprising a processor), smart wearables (e.g., smartwatches), keyboards, touchscreens, mice, a combination thereof, and/or the like. A user of the system 100 can utilize the one or more computer devices 804 to input data into the system 100, control one or more operations of the one or more controllers 502, and/or review one or more outputs of the one or more controllers 502. For example, the one or more computer devices 804 can send data to and/or receive data from the one or more processors 512 of the one or more controllers 502 (e.g., via a direct connection and/or via the one or more networks 802). Additionally, the one or more computer devices 804 can comprise one or more displays that can present one or more outputs generated by the system 100 to a user. For example, the one or more displays can include, but are not limited to: cathode tube display ("CRT"), light-emitting diode display ("LED"), electroluminescent display ("ELD"), plasma display panel ("PDP"), liquid crystal display ("LCD"), organic light-emitting diode display ("OLED"), a combination thereof, and/or the like.

A user of the system 100 can utilize the one or more computer devices 804 and/or the one or more networks 802 to input one or more settings and/or commands into the system 100. For example, in the various embodiments described herein, a user of the system 100 can operate and/or manipulate the one or more controllers 502 and/or associate components via the one or more computer devices 804. Additionally, a user of the system 100 can utilize the one or more computer devices 804 to display one or more outputs (e.g., displays, data, visualizations, and/or the like) generated by the one or more controllers 502 and/or associate components. In one or more embodiments, the one or more computer devices 804 can be comprised within, and/or operably coupled to, a cloud computing environment.

Figure 9:
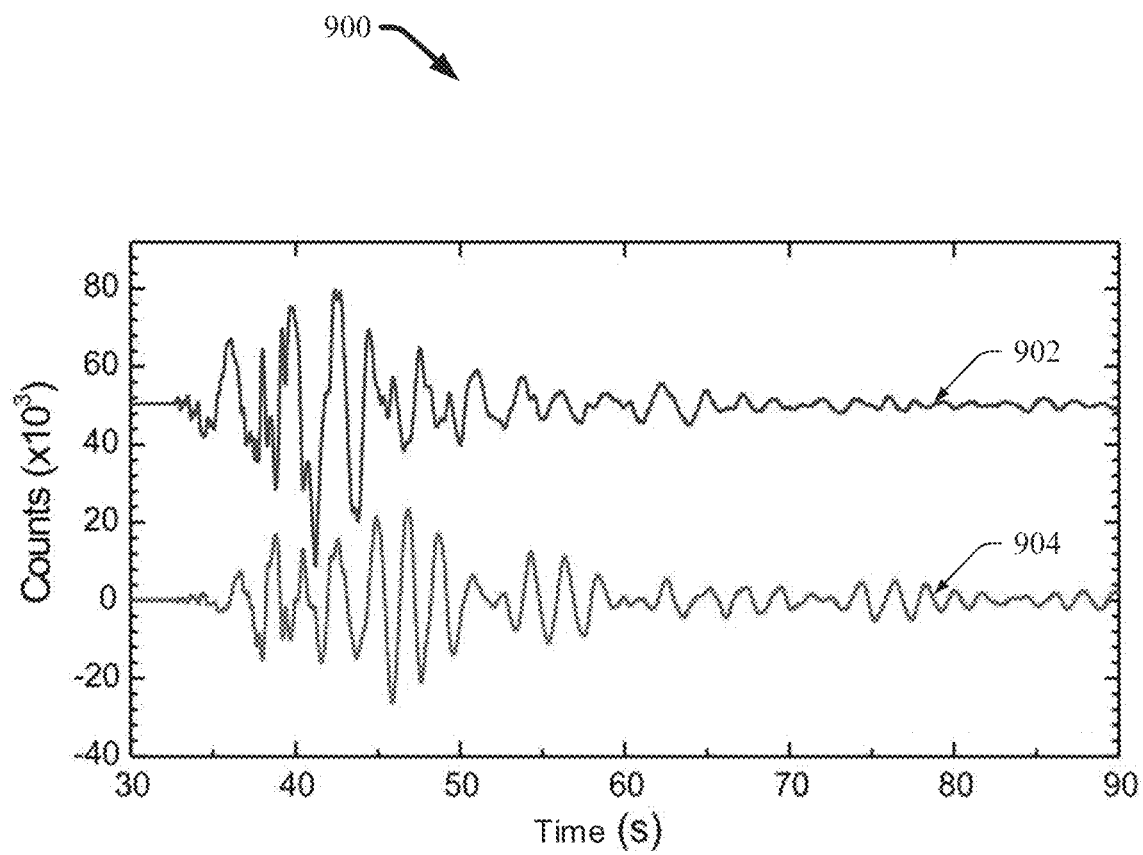
FIG. 9 illustrates a diagram of an example, non-limiting graph that depicts the efficacy of a parallel dipole line trap system using optical sensing technology in accordance with one or more embodiments described herein.

FIG. 9 illustrates a diagram of an example, non-limiting graph 900 that can depict the efficacy of the system 100 through the context of earthquake detection in accordance with one or more embodiments described herein. Repetitive description of like elements employed in other embodiments described herein is omitted for sake of brevity. Graph 900 can show an example earthquake signal detection (a magnitude 4 event on Dec. 3, 2017 at 23:33:46) using the system 100 at Gran Sasso National Laboratory in Italy. The first line 902 shown in graph 900 depicts ground motion detected by a Trillium 120 seismometer. The second line 904 shown in graph 900 depicts the similar motion detected by the system 100 described herein. For example, displacement of the one or more diamagnetic objects 110 in relation to the PDL trap 102 can correlate to the ground motion caused by one or more earthquakes. The similarity between the first line 902 and the second line 904 demonstrates the accuracy, precision, and/or efficacy of the system 100 in monitoring and/or determining displacement of the one or more diamagnetic objects 110 due to various excitations, such as earthquakes. As described herein, the system 100 can be implemented in a multitude of contexts in addition to seismology, and the seismology application depicted in FIG. 9 is an exemplary context to demonstrate the system's 100 efficacy.

Figure 10:
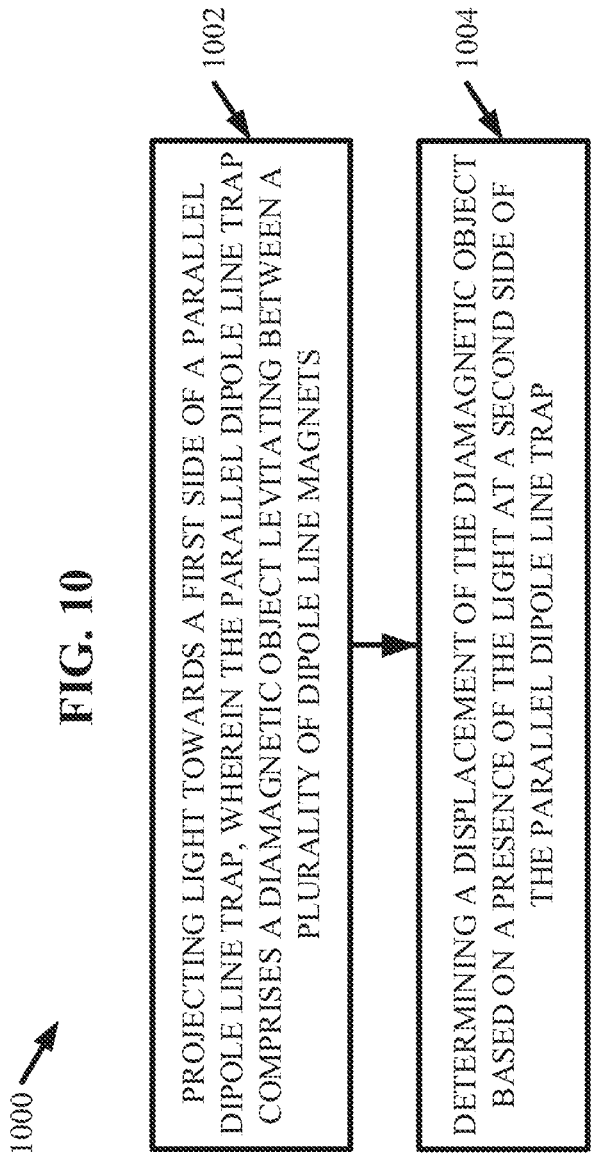
FIG. 10 illustrates a flow diagram of an example, non-limiting method that can facilitate controlling capacitance sensing and/or optical sensing functionality of one or more parallel dipole line trap systems in accordance with one or more embodiments described herein.

FIG. 10 illustrates a flow diagram of an example, non-limiting method 1000 that can facilitate operation of the system 100 in accordance with one or more embodiments described herein. Repetitive description of like elements employed in other embodiments described herein is omitted for sake of brevity.

At 1002, the method 1000 can comprise projecting light towards a first side of a PDL trap 102, wherein the PDL trap 102 can comprise one or more diamagnetic objects 110 levitating between a plurality of dipole line magnets 106. For example, the projecting of light at 1002 can be performed in accordance with the various features of the one or more light sources 112 and/or controllers 502 (e.g., the one or more light drive components 508 and/or processors 512) described herein. For instance, one or more light sources 112 can project light towards a side of the PDL trap 102 that is adjacent to the one or more diamagnetic objects 110 and/or one or more electrodes 108 (e.g., as shown in FIGS. 1-8). Example light sources 112 that can facilitate the projecting at 1002 can include, but are not limited to: incandescent light sources, luminescent light sources (e.g., light emitting diodes), combustion light sources (e.g., candles), electric arc light sources, gas discharge light sources, high-intensity discharge light sources, lasers, a combination thereof, and/or the like.

At 1004, the method 1000 can comprise determining a displacement of the one or more diamagnetic objects 110 based on a presence of the light at a second side of the PDL trap 102. For example, the determining at 1004 can be performed in accordance with the various features of the one or more split photodetectors 104 and/or controllers 502 (e.g., the one or more split photodetector components 510 and/or processors 512) described herein. For instance, one or more split photodetectors 104 can be positioned at the second side of the PDL trap 102, as described herein. Further, the one or more split photodetectors 104 can be operably coupled to one or more split photodetector components 510, which can generate one or more position signals based on varying amounts of light detected by respect split photodetectors 104. The one or more position signals can characterize a differential between the amount of light detected amongst the split photodetectors 104. Additionally, the one or more position signals can indicate the one or more split photodetectors 104 associated with the differential. Further, one or more processors 512 can facilitate the determining at 1004 based on the one or more position signals. Thereby, the method 1000 can facilitate monitoring a PDL trap 102 via one or more optical-based techniques to determine displacement of one or more diamagnetic objects 110 comprised within the PDL trap 102.

FIG. 11 illustrates a flow diagram of an example, non-limiting method 1100 that can facilitate operation of the system 100 in accordance with one or more embodiments described herein. Repetitive description of like elements employed in other embodiments described herein is omitted for sake of brevity.

At 1102, the method 1100 can comprise projecting light towards a first side of a PDL trap 102, wherein the PDL trap 102 can comprise one or more diamagnetic objects 110 levitating between a plurality of dipole line magnets 106. For example, the projecting of light at 1102 can be performed in accordance with the various features of the one or more light sources 112 and/or controllers 502 (e.g., the one or more light drive components 508 and/or processors 512) described herein. For instance, one or more light sources 112 can project light towards a side of the PDL trap 102 that is adjacent to the one or more diamagnetic objects 110 and/or one or more electrodes 108 (e.g., as shown in FIGS. 1-8). Example light sources 112 that can facilitate the projecting at 1102 can include, but are not limited to: incandescent light sources, luminescent light sources (e.g., light emitting diodes), combustion light sources (e.g., candles), electric arc light sources, gas discharge light sources, high-intensity discharge light sources, lasers, a combination thereof, and/or the like.

At 1104, the method 1100 can optionally comprise applying a bias voltage to one or more electrodes 108 that can at least partially surround the one or more diamagnetic objects 110 to change an electric potential of the PDL trap 102 and/or control a displacement of the one or more diamagnetic objects 110. For example, applying the bias voltage at 1104 can be performed in accordance with the various features of the one or more electrodes 108 and/or controllers 502 (e.g., the one or more high voltage converters 504, electrode drive component 506, and/or processors 512) described herein. For instance, the one or more controllers 502 can receive an input signal 516, amplify the input signal 516 (e.g., via the one or more high voltage converters 504), and/or split the input signal 516 into a plurality of drive signals (e.g., first drive signal 518 and/or second drive signal 520). By applying a bias drive signal to one or more electrodes 108, the one or more controllers 502 can manipulate the one or more diamagnetic objects 110 by attracting the one or more diamagnetic objects 110 towards a respective electrode 108 or repelling the one or more diamagnetic objects 110 away from a respective electrode 108. Further, in various embodiments the one or more electrodes 108 can be arranged in one or more configurations (e.g., as shown in FIGS. 1, 3, and/or 4) such that the one or more electrodes 108 can be positioned as a shell around the one or more diamagnetic objects 110 and/or adjacent (e.g., positioned above) to the one or more diamagnetic objects 110.

At 1106, the method 1100 can comprise determining a displacement of the one or more diamagnetic objects 110 based on a presence of the light at a second side of the PDL trap 102. For example, the determining at 1106 can be performed in accordance with the various features of the one or more split photodetectors 104 and/or controllers 502 (e.g., the one or more split photodetector components 510 and/or processors 512) described herein. For instance, one or more split photodetectors 104 can be positioned at the second side of the PDL trap 102, as described herein. Further, the one or more split photodetectors 104 can be operably coupled to one or more split photodetector components 510, which can generate one or more position signals based on varying amounts of light detected by respect split photodetectors 104. The one or more position signals can characterize a differential between the amount of light detected amongst the split photodetectors 104. Additionally, the one or more position signals can indicate the one or more split photodetectors 104 associated with the differential. Further, one or more processors 512 can facilitate the determining at 1106 based on the one or more position signals.

At 1108, the method 1100 can further comprise measuring a capacitance of the PDL trap 102, wherein the determining of the displacement of the diamagnetic object 110 can be further based on the measured capacitance. For example, the measuring at 1108 can be performed in accordance with the various features of the one or more controllers 502 (e.g., the one or more capacitance sense components 702, switches 704, and/or processors 512) described herein. For instance, the one or more switches 704 can decouple the one or more electrode drive components 506 from the one or more electrodes 108 and couple the one or more capacitance sense components 702 to the one or more electrodes 108 to facilitate the measuring at 1108. As the one or more diamagnetic objects 110 are displaced within the PDL trap 102 (e.g., oscillate within the PDL trap 102) the capacitance of the electrodes 108 can change. In other words, the proximity of the one or more diamagnetic objects 110 to a respective electrode 108 can create one or more capacitance differentials, which can be detected by the one or more capacitance sense components 702. Thereby, the capacitance measurements facilitated by the one or more capacitance sense components 702 can facilitate the one or more processors 512 in determining the displacement of the one or more diamagnetic objects 110, as described herein. Thereby, the method 1100 can facilitate monitoring a PDL trap 102 via a plurality of available detection techniques (e.g., optical-based and/or capacitance-based detection techniques) to determine displacement of one or more diamagnetic objects 110 comprised within the PDL trap 102.

Figure 12:
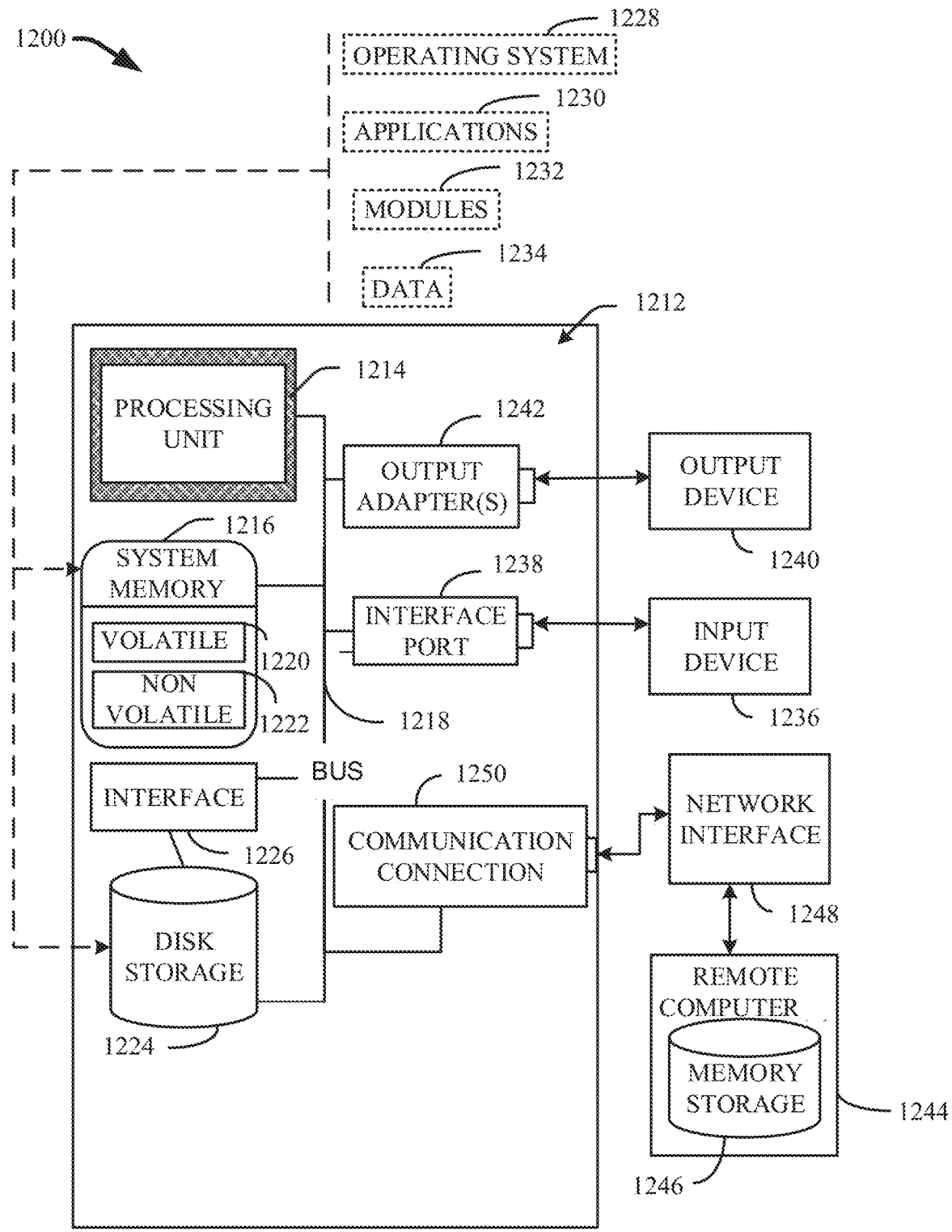
FIG. 12 illustrates a block diagram of an example, non-limiting operating environment in which one or more embodiments described herein can be facilitated.

In order to provide a context for the various aspects of the disclosed subject matter, FIG. 12 as well as the following discussion are intended to provide a general description of a suitable environment in which the various aspects of the disclosed subject matter can be implemented. FIG. 12 illustrates a block diagram of an example, non-limiting operating environment in which one or more embodiments described herein can be facilitated. Repetitive description of like elements employed in other embodiments described herein is omitted for sake of brevity. With reference to FIG. 12, a suitable operating environment 1200 for implementing various aspects of this disclosure (e.g., facilitate an environment to implement one or more features of the one or more controllers 502 and/or computer devices 804 described herein) can include a computer 1212. The computer 1212 can also include a processing unit 1214, a system memory 1216, and a system bus 1218. The system bus 1218 can operably couple system components including, but not limited to, the system memory 1216 to the processing unit 1214. The processing unit 1214 can be any of various available processors. Dual microprocessors and other multiprocessor architectures also can be employed as the processing unit 1214. The system bus 1218 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 1216 can also include volatile memory 1220 and nonvolatile memory 1222. The basic input/output system (BIOS), containing the basic routines to transfer information between elements within the computer 1212, such as during start-up, can be stored in nonvolatile memory 1222. By way of illustration, and not limitation, nonvolatile memory 1222 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1220 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1212 can also include removable/non-removable, volatile/non-volatile computer storage media. FIG. 12 illustrates, for example, a disk storage 1224. Disk storage 1224 can also include, but is not limited to, devices like a magnetic disk drive, floppy disk drive, tape drive, Jaz drive, Zip drive, LS-100 drive, flash memory card, or memory stick. The disk storage 1224 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1224 to the system bus 1218, a removable or non-removable interface can be used, such as interface 1226. FIG. 12 also depicts software that can act as an intermediary between users and the basic computer resources described in the suitable operating environment 1200. Such software can also include, for example, an operating system 1228. Operating system 1228, which can be stored on disk storage 1224, acts to control and allocate resources of the computer 1212. System applications 1230 can take advantage of the management of resources by operating system 1228 through program modules 1232 and program data 1234, e.g., stored either in system memory 1216 or on disk storage 1224. It is to be appreciated that this disclosure can be implemented with various operating systems or combinations of operating systems. A user enters commands or information into the computer 1212 through one or more input devices 1236. Input devices 1236 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 1214 through the system bus 1218 via one or more interface ports 1238. The one or more Interface ports 1238 can include, for example, a serial port, a parallel port, a game port, and a universal serial bus (USB). One or more output devices 1240 can use some of the same type of ports as input device 1236. Thus, for example, a USB port can be used to provide input to computer 1212, and to output information from computer 1212 to an output device 1240. Output adapter 1242 can be provided to illustrate that there are some output devices 1240 like monitors, speakers, and printers, among other output devices 1240, which require special adapters. The output adapters 1242 can include, by way of illustration and not limitation, video and sound cards that provide a means of connection between the output device 1240 and the system bus 1218. It should be noted that other devices and/or systems of devices provide both input and output capabilities such as one or more remote computers 1244.

Computer 1212 can operate in a networked environment using logical connections to one or more remote computers, such as remote computer 1244. The remote computer 1244 can be a computer, a server, a router, a network PC, a workstation, a microprocessor based appliance, a peer device or other common network node and the like, and typically can also include many or all of the elements described relative to computer 1212. For purposes of brevity, only a memory storage device 1246 is illustrated with remote computer 1244. Remote computer 1244 can be logically connected to computer 1212 through a network interface 1248 and then physically connected via communication connection 1250. Further, operation can be distributed across multiple (local and remote) systems. Network interface 1248 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 1250 refers to the hardware/software employed to connect the network interface 1248 to the system bus 1218. While communication connection 1250 is shown for illustrative clarity inside computer 1212, it can also be external to computer 1212. The hardware/software for connection to the network interface 1248 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a plurality of electrodes having a plurality of gaps between adjacent ones of the plurality of electrodes;
    a plurality of light sources aligned with the plurality of gaps such that a light source of the plurality of light sources is positioned over a gap of the plurality of gaps;
    a parallel dipole line trap comprising:
        a diamagnetic object positioned between a plurality of dipole line magnets and being at least partially surrounded by the plurality of electrodes, wherein the plurality of electrodes are arranged in a shell configuration at least partially surrounding the diamagnetic object; and
    a split photodetector sensor positioned adjacent to the parallel dipole line trap, wherein the split photodetector sensor detects a displacement of the diamagnetic object.

2. The system of claim 1, wherein the split photodetector sensor comprises:
    a light source of the plurality of light sources, wherein the light source is positioned adjacent to a first side of the parallel dipole line trap; and
    a plurality of photodetectors positioned adjacent to a second side of the parallel dipole line trap.

3. The system of claim 2, further comprising:
    a processor, operatively coupled to the split photodetector sensor, that determines the displacement based on the light emitted by the light source and detected by the split photodetector sensor.

4. The system of claim 1, further comprising:
    a capacitance sensor connected to the plurality of electrodes and the plurality of dipole line magnets, wherein the capacitance sensor measures a capacitance of the plurality of electrodes.

5. The system of claim 4, wherein the capacitance of the plurality of electrodes is based on a position of the diamagnetic object between the plurality of electrodes.

6. The system of claim 4, further comprising:
    a processor operatively coupled to the split photodetector sensor and the capacitance sensor, wherein the processor determines a position of the diamagnetic object based on a measurement selected from a group consisting of a differential light detected by the split photodetector sensor and a differential in the capacitance measured by the capacitance sensor.

7. The system of claim 6, further comprising:
    a voltage source connected to the plurality of electrodes.

8. The system of claim 7, further comprising:
electrode drive circuitry connected to the plurality of electrodes that splits an input drive signal to drive an electrode from the plurality of electrodes.

9. A method, comprising:
projecting light towards a first side of a parallel dipole line trap, wherein the parallel dipole line trap comprises a diamagnetic object levitating between a plurality of dipole line magnets, wherein the plurality of dipole line magnets are at least partially surrounded by a plurality of electrodes arranged in a shell configuration at least partially surrounding the diamagnetic object, wherein the plurality of electrodes comprise a non-magnetic metal, and wherein a plurality of light sources are positioned at opposite sides of the parallel dipole line trap; and
determining a displacement of the diamagnetic object based on a presence of the light at a second side of the parallel dipole line trap.

10. The method of claim 9, further comprising:
detecting the light at the second side of the parallel dipole line trap by a split photodetector sensor.

11. The method of claim 9, further comprising:
applying a bias voltage to an electrode of the plurality of electrodes that at least partially surround the diamagnetic object to change an electric potential of the parallel dipole line trap and control the displacement of the diamagnetic object.

12. The method of claim 11, further comprising:
measuring a capacitance of the parallel dipole line trap, wherein the determining the displacement of the diamagnetic object is further based on the capacitance.

13. The method of claim 9, further comprising:
splitting an electrical input signal into an electrode drive signal that is directed to an electrode of the plurality of electrodes, wherein the electrode is positioned adjacent to the diamagnetic object.

14. The method of claim 9, wherein the determining is performed by a processor.

15. A system comprising:
an apparatus comprising:
a plurality of electrodes comprising:
a first plurality of electrodes arranged in a shell configuration; and
a second plurality of electrodes arranged linearly adjacent each one of the first plurality of electrodes, wherein a first gap is between a one of the second plurality of electrodes and a one of the first plurality of electrodes and wherein a second gap is between a second one of the second plurality of electrodes and a second one of the first plurality of electrodes; and
a parallel dipole line trap comprising a diamagnetic object positioned between a plurality of dipole line magnets and being at least partially surrounded by the plurality of electrodes, wherein the plurality of electrodes arranged in the shell configuration is at least partially surrounding the diamagnetic object;
sensory circuitry positioned adjacent to the parallel dipole line trap, and comprising a photodetector to detect a displacement of the diamagnetic object; and
a controller electrically coupled to the apparatus and comprising:
a high voltage converter;
an electrode drive component configured to electrically bias an electrode of the plurality of electrodes;
a split detector component; and
a light drive component.

16. The system of claim 15, further comprising:
a light source positioned adjacent to a first side of the parallel dipole line trap, wherein the photodetector is a split photodetector positioned adjacent to a second side of the parallel dipole line trap.

17. The system of claim 15, further comprising:
control circuitry, operatively coupled to the sensory circuitry, and comprising a processor that determines a position of the diamagnetic object based on the displacement.

18. The system of claim 17, wherein the sensory circuitry further comprises a capacitance sensor to measure a differential capacitance of the plurality of electrodes comprised within the parallel dipole line trap, and wherein the processor determines the position of the diamagnetic object based further on the differential capacitance.

19. The system of claim 18, further comprising:
electrode drive circuitry, operatively coupled to the parallel dipole line trap, and that supplies a voltage to change an electrostatic potential of the plurality of electrodes.

20. The system of claim 19, wherein the electrode drive circuitry generates the voltage by splitting an input drive signal and supplies the voltage to an electrode of the plurality of electrodes, wherein the electrode is positioned adjacent to the diamagnetic object.

\* \* \* \* \*